United States Patent
Boesch et al.

(10) Patent No.: US 6,370,203 B1
(45) Date of Patent: Apr. 9, 2002

(54) POWER CONTROL FOR WIRELESS COMMUNICATIONS SYSTEM

(75) Inventors: Ronald D. Boesch, Morrisville; Peter J. Doherty, Apex, both of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/186,493

(22) Filed: Nov. 4, 1998

(51) Int. Cl.[7] .............................. H04B 1/38; H04B 1/00
(52) U.S. Cl. ...................... 375/297; 375/298; 455/522; 455/69
(58) Field of Search ................................. 375/135, 136, 375/140, 146, 147, 295, 298, 308, 312, 297; 455/75, 522, 69, 70, 115; 370/342, 252

(56) References Cited

U.S. PATENT DOCUMENTS

| | | | |
|---|---|---|---|
| 5,056,109 A | | 10/1991 | Gilhousen et al. .............. 375/1 |
| 5,193,223 A | * | 3/1993 | Walczak et al. ............. 455/115 |
| 5,267,262 A | * | 11/1993 | Wheatley, III .................. 375/1 |
| 5,708,681 A | | 1/1998 | Malkemes et al. |
| 5,745,480 A | * | 4/1998 | Behtash et al. .............. 370/252 |
| 6,070,058 A | * | 5/2000 | Waldroup et al. .............. 455/69 |
| 6,101,179 A | * | 8/2000 | Soliman ...................... 370/342 |
| 6,236,863 B1 | * | 5/2001 | Waldroup et al. ........... 455/522 |

FOREIGN PATENT DOCUMENTS

GB 2317283 A 3/1998

* cited by examiner

Primary Examiner—Chi Pham
Assistant Examiner—Dung X. Nguyen
(74) Attorney, Agent, or Firm—Coats & Bennett, P.L.L.C.

(57) ABSTRACT

Power control circuitry for the transmitting section of a mobile terminal provides gain control for amplifiers operating at different frequencies. Preferably, one amplifier controls the signal gain the signal transmission path in the IF section and another amplifier controls gain in the signal transmission path in the radio frequency (RF) section. One variable gain amplifier may be controlled based on the strength of the received signals while the other may be controlled based on commands from the base station and/or calibration and alignment settings during manufacturing. In addition, one or both of the amplifiers may optionally be controlled in whole or in part based on calibration and/or alignment settings established during manufacturing. Preferably, the gain control signal based on received signal strength is analog based and the control signal received from the control system is a pure digital signal substantially immune to noise. In such an embodiment, the corresponding amplifier is configured to receive a digital value and provide a corresponding amplifier gain.

41 Claims, 4 Drawing Sheets

POWER CONTROL FOR WIRELESS COMMUNICATIONS SYSTEM

BACKGROUND OF THE INVENTION

The present invention relates to mobile telephone and related wireless communications systems, and, particularly, to a novel and improved method for controlling transmitter power in code division multiple access (CDMA) mobile terminals.

Wireless communications systems, such as cellular telephone systems, generally require at least one mobile terminal and any number of base stations to provide full duplex communications between the mobile terminal and the base station providing the best communication path. Typical mobile communications are accomplished using CDMA spread-spectrum communication signals. Such techniques allow the frequency spectrum to handle multiple transmissions, thereby significantly increasing communication capacity. In CDMA systems, proper control of transmitter power for each mobile terminal is required to reduce interference with other users and further increase system capacity.

During operation, the distance between a mobile terminal and a base station may constantly change, and the particular base station through which communications are facilitated may also change. Furthermore, ground-based mobile communications systems are subject to signal propagation losses due to interference from other communications systems, changes in landscape, and physical structures. Given the constantly changing and unpredictable environment in which communications are provided, a mobile terminal must constantly control its transmit power to ensure sufficient signal strength to transmit signals to the base station as well as minimize interference with other systems and communication channels.

Mobile terminals generally control their transmit power based on power control commands received from the base station and the strength of signals received from the base station. Additional background information is provided in U.S. Pat. No. 5,056,109 entitled METHOD AND APPARATUS FOR CONTROLLING TRANSMISSION POWER IN A CDMA CELLULAR MOBILE TELEPHONE SYSTEM, the disclosure of which is incorporated herein by reference.

As noted, transmit power is typically controlled using commands from the base station and the strength of the received signals via gain signals provided to one or more variable gain amplifiers operating in the terminal's intermediate frequency (IF). The commands from the base station are generally processed by the mobile terminal's receiving circuitry and control system and typically provide a method of fine tuning the terminal's transmit power level. Control based on received signal strength typically provides a method of coarse tuning the terminal's transmit power level.

Typically, a mobile terminal has an automatic gain control (AGC) detector configured to provide a gain control signal based on the signal strength of received signals. The gain control signal is also provided to a variable gain amplifier operating in the intermediate frequency. Generally, both of these gain control signals are provided in analog form to a single variable gain amplifier with multiple gain controls or separate amplifiers having a single gain control. U.S. Pat. No. 5,056,109, mentioned above, provides a system configured with dual variable gain amplifiers, both operating in the IF range under analog control.

Currently, mobile terminals have relatively large power control requirements necessitating precise control throughout a wide range of operation. These terminals provide more and more processing ability in smaller packages. As the terminals become smaller, provide more processing power, and are required to operate over widely varying power levels, isolating highly sensitive gain control signals from noise and other signal components stemming from analog and digital circuitry becomes more difficult. As the terminals continue to decrease in size, and the terminal's electronics become more integrated, design techniques of the prior art will have difficulty achieving precise control over wide operating ranges. Furthermore, providing a single integrated circuit solution for a terminal's transmitter electronics would be difficult to implement.

Thus, there is a need for an improved transmission power control technique for mobile terminals. There is a need to provide greater isolation of gain control signals from the ever-increasing number of digital and analog signals present in telephone electronics and integrated circuits, as well as a need to decrease the sensitivity of gain control signals for the various variable gain amplifiers in these systems.

SUMMARY OF THE INVENTION

Power control circuitry of the present invention cooperates with the transmitting section of a mobile terminal to provide gain control for variable gain amplifiers operating on signals of different frequencies. Preferably, one variable gain amplifier controls the gain of signals in the signal transmission path in the IF section and another variable gain amplifier controls gain in the signal transmission path in the radio frequency (RF) section. One variable gain amplifier may be controlled based on the strength of the received signals while the other may be controlled based on commands from the base station. In addition, one or both of the amplifiers may optionally be controlled in whole or in part based on calibration and/or alignment settings established during manufacturing. Preferably, the gain control signal based on received signal strength is a pure digital signal substantially immune to noise and the control signal received from the control system is analog based. Amplifiers receiving the digital control signal are configured to provide a corresponding amplifier gain.

These and other aspects of the present invention will become apparent to those skilled in the art after reading the following description of the preferred embodiments when considered with the drawings.

DETAILED DESCRIPTION

In the following description, like reference characters designate like or corresponding parts throughout the several figures. Referring now to the drawings in general, and FIG. 1 in particular, it will be understood that the illustrations are for the purpose of describing preferred embodiments of the invention and are not intended to limit the invention thereto. In order to better understand the invention and appreciate the improvements in mobile communications provided thereby, an overview of the state-of-the-art prior to applicants' invention is provided with reference to FIG. 1. For clarity, the present discussion will assume that the wireless communications mobile terminal is a cellular telephone. However, it is to be understood that other wireless communications devices, such as personal communications assistants, and the like are also within the scope of the present invention.

Figure 1:
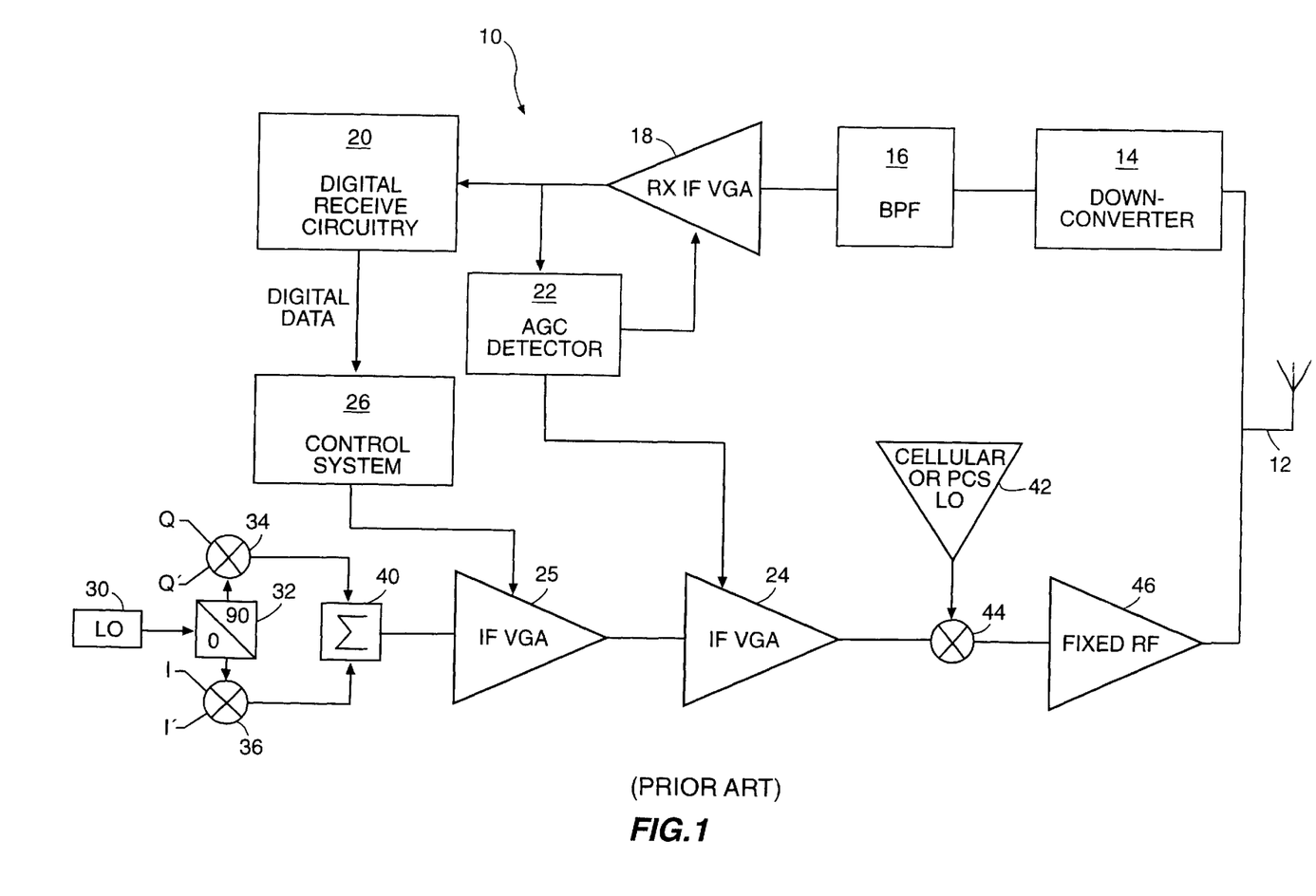
FIG. 1 is a block schematic of a prior art embodiment of a mobile telephone.

As discussed above, a mobile communications terminal ("mobile terminal"), such as a cellular telephone and generally designated 10, usually includes circuitry capable of providing full duplex communications between the mobile terminal and one of any number of base stations within a given proximity. During operation, the mobile terminal 10 generally receives a pilot signal, set up channel signals, and address signals using antenna 12, and analog and/or digital receiving circuitry. Typically, the receiving circuitry will amplify and down-convert received RF CDMA signals to IF using any number of amplifiers (not shown) and a down converter 14. The IF signals are coupled to a band-pass filter 16 where frequency components outside the IF band are removed. After filtering, the IF signals are provided to a variable gain IF (receive) amplifier 18 where the signals are amplified to a nominal level. The output of the IF (receive) amplifier 18 is provided to digital receive circuitry 20 for various digital signal processing operations, including extracting data and voice information.

The receive circuitry is also configured to measure the combined power of the receive signals in order to generate a feedback signal for controlling transmit power. The feedback signal is generated by an automatic gain control (AGC) detector 22, which also receives the filtered signals output from the IF (receive) amplifier 18. In addition to controlling transmit power, the feedback signal may also be used to control the gain of the IF (receive) amplifier 18 to ensure proper voltage levels into the receive circuitry 20. The AGC detector 22 generates a gain control signal which is coupled to a gain control input of an IF variable gain amplifier (VGA) 24 located in the mobile terminal's signal transmission path.

A control system 26 is associated with the digital receive circuitry 20 to receive data and provide the signal processing described above and additional signal processing on data received from the incoming signals. In certain embodiments, the control system 26 provides an analog control voltage, typically by filtering a serial bit stream, to control an additional IF variable gain amplifier 25, which is also located in the mobile terminal's transmission path.

Although the IF variable gain amplifiers 24, 25 in the transmission path are shown in separate units, these amplifiers may be combined into a single variable gain amplifier with two control inputs for receiving the gain control signals from the control system 26 and the AGC detector 22. Gain control from the control system 26 is based on commands received from the base station wherein gain control from the AGC detector 22 is a function of the strength of the receive signals.

Many modern wireless communication systems use quadrature modulation to up-convert data for transmission to an IF ranging anywhere from 1 MHz up to a couple of hundred megahertz. The transmission circuitry in such an embodiment typically includes a local oscillator 30 having a frequency which is preferably twice that of the desired IF driving a 90 degree quadrature phase shifter 32, which drives two double-balanced mixers 34, 36. Data to be transmitted is provided to the Q and I inputs of the double-balanced mixers 34, 36, respectively. The Q' and I' inputs receive the complement of the Q and I input data, respectively. The outputs of the double-balanced mixers 34, 36 are summed by summing circuitry 40 to provide a quadrature signal modulated by the IF. This signal is subsequently amplified by the IF variable gain amplifiers 25, 24 and modulated to RF using a cellular or PCS local oscillator 42 and another double-balanced mixer 44. The resulting RF signal may be further amplified by fixed gain amplifier 46 and transmitted via antenna 12.

As described, the control system may provide gain control based on power level commands received from the base station, and the AGC detector 22 may provide further gain control based on the power level of the received signals. The problem with the above-described prior art embodiment using one or two variable gain amplifiers in the IF section are two fold. First, the ever-increasing need to minimize circuit layout and integrate electronics for smaller and more compact telephones makes it difficult to isolate the input signals to the variable gain amplifiers from the gain control signal. Such leakage not only negatively affects transmission response, but also limits the available range because the noise effectively defeats part of the amplifiers' operating range. Second, today's phones require ever-increasing operating range control.

Currently, the amount of control range required to respond to the standard phone request is 85 dB. This 85 dB operating range does not take into account alignment and calibration during manufacturing. It is not uncommon for factory calibration adjustments to be 20 dB or more for dual-band telephones. With the standard phone request range of 85 dB and an additional 20 dB necessary for calibration, the telephone's operating range quickly exceeds 105 dB. This number may increase as mobile communications increase.

In essence, mobile telephones are becoming more and more integrated because smaller, cheaper, and more reliable products are driving the market. The level of integration continues to increase. Currently, dedicated surface-mount integrated circuits and other electronic components are being placed closer and closer to one another. In the near future, dedicated integrated circuits will provide large sections, if not all, of the transmission receiving electronics. Furthermore, these telephones are becoming more and more sophisticated and require significant amounts of data and digital signal processing. As the phones become smaller, more and more signals of varying frequencies and types are forced closer together. When this occurs, present circuit designs will not provide the necessary isolation for reliable operation.

Of primary concern for this invention is the transmit IF variable gain amplifiers 24 and 25 of the prior art and the respective circuitry providing gain control which cause sensitivity and isolation problems. If the circuit is implemented using only one IF variable gain amplifier, the large output range requires a gain control signal highly susceptible to noise given the high amount of sensitivity required for operation. If multiple IF VGAs are used, the sensitivity for each gain control signal is lessened; however, noise or spurs on the transmit signal at the input of the first VGA may contaminate the transmit signal output of the second VGA.

Applicants' solution reduces sensitivity for gain control signals while providing gain control over the large operational range required by mobile communications. The solution requires at least two variable gain amplifiers, each of which operates to amplify signals of different stages or frequencies. In particular, one variable gain amplifier operates in the IF stage while the other operates in the RF stage. For the sake of conciseness and ease of comparison, the basic block diagram of the prior art shown in FIG. 1 is modified with an embodiment exemplary of the inventive concept provided by the applicants in FIG. 2 and FIG. 3. In essence, an IF (transmit) variable gain amplifier 50 is placed in the transmission path at the IF stage and an RF variable gain amplifier 52 is placed in the transmission path in the RF stage after the signal to be transmitted is modulated by the cellular or PCS local oscillator 42 and mixer 44. An optional IF filter 54 is shown in the transmission path before the RF stage for filtering out spurious frequency components occurring outside the desired signal's bandwidth.

Importantly, control for the IF (transmit) variable gain amplifier 50 and the RF variable gain amplifier 52 are provided by separate circuitry. Ideally, both gain control signals would be digital because full digital gain control is highly tolerant of surrounding noise and spurs. However, full digital control may not be possible in all situations. In particular, it may be necessary to implement fast response gain control using an analog control signal to avoid incurring undue time delays in VGA response. Accordingly, the present invention will be illustrated with one gain signal being digital and the other being analog, although both may be analog or both may be digital. Thus, at least one of the variable gain amplifiers (either IF (transmit) or RF) should be configured to receive the digital signal and provide a corresponding gain. Preferably, the IF (transmit) variable gain amplifier is configured to provide the majority of the system's operating range since it is easier to achieve isolation at the intermediate frequencies (IF) than the higher, radio frequencies (RF).

Figure 2:
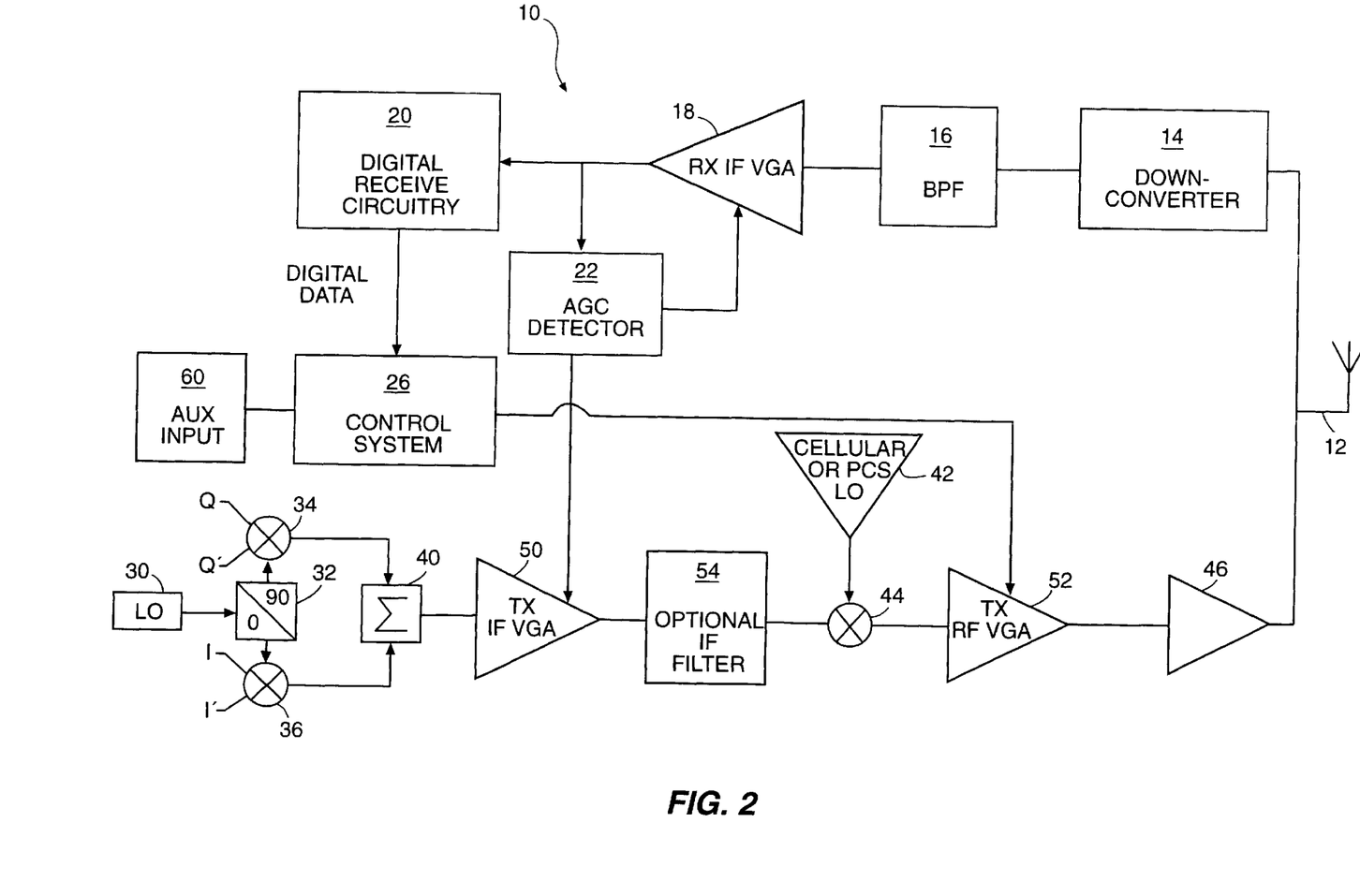
FIG. 2 is a block schematic of a first preferred embodiment of a mobile telephone configured according to the present invention.

In the embodiment shown in FIG. 2, the IF (transmit) variable gain amplifier 50 receives a gain signal provided by the AGC detector 22 while the RF variable gain amplifier 52 receives gain control from the control system 26. In this embodiment, the output from the AGC detector 22 is a digital signal while the output from the control system 26 is an analog signal. It is anticipated that the power level change command from the base station will be a one bit command limited to either up one level or down one level. Thus, the processing of this power level command by the digital receive circuitry 20 may be extremely fast and the command may be forwarded to the control system 26 very quickly. Inside the control system 26 the power level command from the base station may be interpreted and the output from the control system 26 RF to the variable gain amplifier 52 may very quickly undergo a digital to analog conversion internal to the control system 26. It should be noted that when the RF variable gain amplifier 52 is under digital control, it may not be necessary for the RF variable gain amplifier 52 to have infinitely variable gain control, a series of discrete steps of allowed gain may be sufficient.

Figure 3:
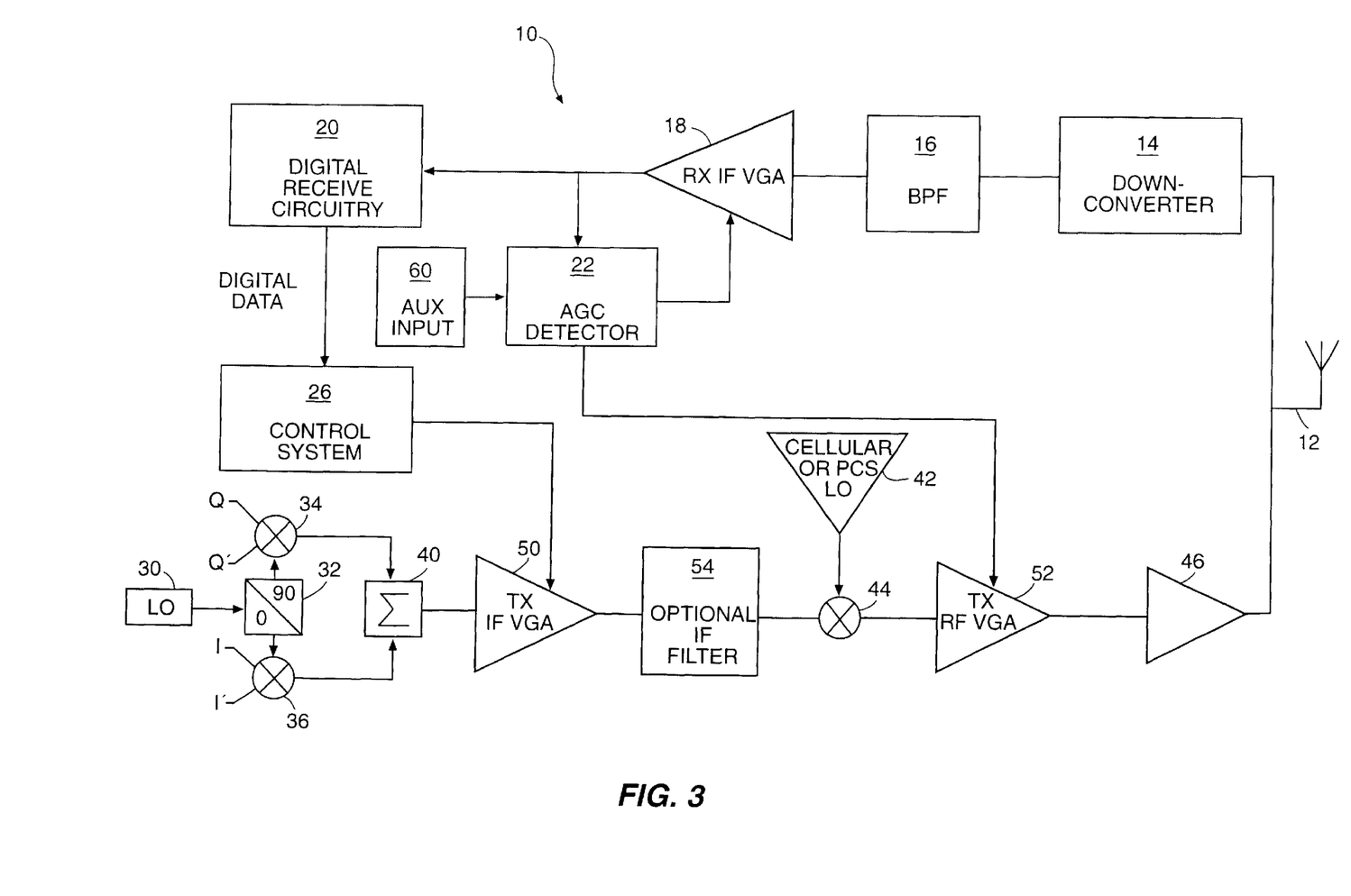
FIG. 3 is a block schematic of a second preferred embodiment of a mobile telephone configured according to the present invention.

FIG. 3 depicts a variation on the inventive concept wherein the RF variable gain amplifier 52 is used to respond to gain control emanating from the AGC detector 22 while the IF (transmit) variable gain amplifier 50 responds to gain control from the control system 26.

Gain throughout the system can be proportioned as desired to provide sufficient sensitivity and control responsive to changes in the receive signal and/or command received from a base station. For example, if the necessary gain burden is 110 dB, a designer could delegate 55 dB for the digital interface at either the IF or RF stage and 55 dB for the analog interface at the other frequency. The gain burden may be split into any ratio so long as the noise problems are reduced and gain control is provided over the desired operating range. Thus, the gain for one section may be 10, 20, 30, 40, 50, 60, 70, 80, 90 dB, etc., with the gain for the remaining section making up for the overall control range.

In addition, the control signals for the variable gain amplifiers 50,52 may be based at least partially upon calibration and/or alignment adjustments ("calibration type information"), such as those set by the terminal's manufacturer. This calibration type information may be input to the control system 26 via an auxiliary input 60 (see FIG. 2) and/or to the AGC detector 22 (see FIG. 3), or to either via a switch (not shown) downstream from the auxiliary input 60. The control signals which are at least partially based on the calibration information are not necessarily routed only to the RF variable gain amplifier 52, but may instead, depending on the configuration, be routed to the IF (transmit) variable gain amplifier 50, or to both variable gain amplifiers 50,52. The auxiliary input 60 may be anything from a keypad to a input port responding to calibration and alignment data during the manufacturing process. This calibration type information is, typically used to create more terminal to terminal uniformity in transmit power profiles; it is not anticipated that the amount of gain imparted according to this calibration type information will change during normal operation.

Figure 4:
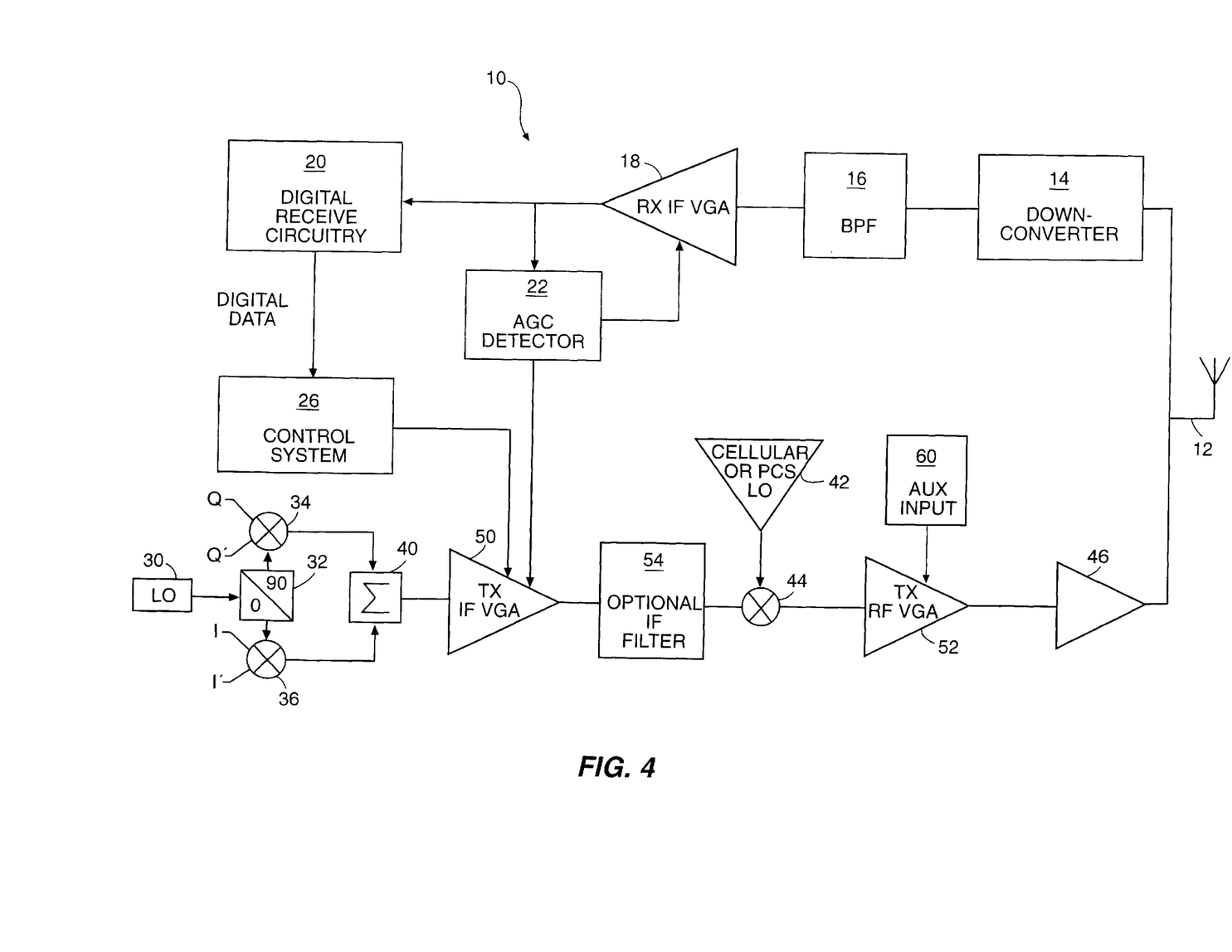
FIG. 4 is a block schematic of a third embodiment of a mobile telephone configured according to the present invention.

In an alternative configuration shown in FIG. 4, the control signals from the AGC detector 22 and the control system 26 are both routed to one or the other of the variable gain amplifiers 50,52, in the case shown the IF (transmit) variable gain amplifier 50. The particular variable gain amplifier receiving such control signals should be capable of receiving and responding to two control inputs, preferably including a digital input and an analog one. The gain of the other variable gain amplifier, in the case shown the RF variable gain amplifier 52, is set in accordance with the calibration type information from the auxiliary input 60. Thus, the control signals from the AGC detector 22 and/or the control system 26 control the gain at one frequency (IF) while the calibration type information controls the gain at another frequency (RF). Naturally, the configuration could be swapped from that shown in FIG. 4 such that the calibration type information controls the IF (transmit) variable gain amplifier 50, while the control signals from the AGC detector 22 and the control system 26 control the RF variable gain amplifier 52.

The Telecommunications Industry Association Interim Standard IS-95 CDMA standard for mobile communications currently provides an 85 dB control range controllable in 1 dB steps. The standard is very sensitive to output control and any steps towards reducing response variation based on noise is significant. For example, typical systems may include a 45 dB/V sensitivity, which is relatively large. A 10 millivolt noise signal would cause a 0.45 dB variation of AM power modulation. For calibration and alignment purposes, another 20 dB of range is generally necessary and increases the sensitivity of the system to 55 dB/V. With the current invention, the gain burden can be split between the digital and analog control signals. For example, modifying the above-mentioned system according to the present invention and splitting the gain burden with 55 dB reserved for the digital interface at one frequency and 50 dB for the analog interface at another frequency, the analog sensitivity is reduced to 25 dB/V, and the same 10 millivolt signal would only provide a 0.25 dB disturbance, as opposed to 0.45 dB. The 0.2 dB reduction is significant. As the capacity of the IS-95 CDMA standard is very sensitive to output power control, as indicated by the required 85 dB control range controllable in 1 dB steps, it is important to minimize any change to the desired output power due to noise getting on the control line.

One could further reduce the sensitivity by assigning 20 dB to the analog controlled variable gain amplifier and 85 dB to the digital controlled variable gain amplifier. In this case, the digital interface would be immune from noise, and the analog sensitivity would be reduced to 10 dB/V. The same disturbance in this case would only add a 0.1 dB response variation to a 10 millivolt signal. The flexibility of apportioning gain in a highly integrated solution between digital and analog control at different frequencies is key to a phone designer working in ever increasingly smaller spaces.

This problem has not been appreciated or addressed by designers of application specific integrated circuits (ASIC) and mobile terminals prior to this point. The industry did not understand the risk provided to the capacity of the IS-95 standard by regulating output power with an overly sensitive analog control signal, especially one controlled by a 2-volt control signal range. Furthermore, until Applicants' invention, an integratable solution to on-chip isolation problems had not been previously addressed in an adequate fashion. In integrated circuit embodiments, the local oscillator 42 may be integrated with or separate from a package containing amplifiers 50 and 52.

Applicants' invention provides a design capable of being implemented not only in a multicomponent embodiment, but also a fully integrated solution wherein amplifiers of different frequencies may be integrated on a single chip that may also include mixers, local oscillators, digital circuitry, or any other control or communications circuitry. Any number or combination of mixers, amplifiers, and control circuitry may be implemented in a single integration using applicants' circuitry design and control technologies. Those skilled in the art will recognize that integration may be provided at varying levels to include varying combinations of circuit elements. Importantly, prior to applicants' invention, successful integration of substantial portions of a mobile telephone's transmission circuitry would have been far less than optimal.

Certain modifications and improvements will occur to those skilled in the art upon reading the foregoing description. It should be understood that all such modifications and improvements have been omitted for the sake of conciseness and readability, but are properly within the scope of the following claims.

We claim:

1. In a wireless communications system in which users communicate using spread spectrum communications via a mobile terminals and at least one base station, a transmission power control circuit for controlling transmission signal power for a mobile terminal, wherein each mobile terminal includes an antenna and a receiver, said power control circuit comprising:
   a. a signal path in the mobile terminal amplifying a signal to be transmitted, said path having a first portion for said signal gain controlled at a first frequency and a second portion for said signal further gain controlled at a second frequency;
   b. a first variable gain amplifier for amplifying signals operating about the first frequency in said first portion of said signal path, said first variable gain amplifier having a gain control input and adapted to provide amplification gain proportional to a first control signal received at the gain control input;
   c. a second variable gain amplifier for amplifying signals operating about the second frequency in said second portion of said signal path, said second variable gain amplifier having a gain control input and adapted to provide amplification gain proportional to a second control signal received at the gain control input; and
   d. one of said first or second control signals being responsive to relative power levels of signals received by the mobile terminal's receiver and the other of said first or second control signals responsive to power level commands.

2. The mobile terminal power control circuit of claim 1 wherein said circuit includes a mixer in said signal path between said first and second variable gain amplifiers, said mixer configured to alter the frequency of said signals in said signal path from the first frequency to the second frequency.

3. The mobile terminal power control circuit of claim 1 wherein the first frequency is an intermediate frequency used for spread spectrum communications.

4. The mobile terminal power control circuit of claim 1 wherein the second frequency is a radio frequency.

5. The mobile terminal power control circuit of claim 1 wherein the first frequency is an intermediate frequency used for spread spectrum communications and the second frequency is a radio frequency for final transmission.

6. The mobile terminal power control circuit of claim 1 wherein said first variable gain amplifier, receives said control signal responsive to power level commands and said second variable gain amplifier receives said control signal responsive to relative power levels of signals received by the mobile terminal's receiver.

7. The mobile terminal power control circuit of claim 1 wherein said first and second portions of said signal path and said first and second variable gain amplifiers are integrated into a single integrated circuit chip.

8. The mobile terminal power control circuit of claim 2 wherein said first and second portions of said signal path, said first and second variable gain amplifiers, and said mixer are integrated into a single integrated circuit chip.

9. The mobile terminal power control circuit of claim 1 wherein said first variable gain amplifier is a analog controlled variable gain amplifier and said second variable gain amplifier is an digital controlled variable gain amplifier, said first variable gain amplifier adapted to provide a gain proportional to the power level commands received by the terminal, and said second variable gain amplifier adapted to provide a gain proportional to relative power levels of signals received by the mobile terminal's receiver.

10. The mobile terminal power control circuit of claim 1 wherein said first variable gain amplifier is a digitally controlled variable gain amplifier and said second variable gain amplifier is an analog controlled variable gain amplifier, said first variable gain amplifier adapted to provide a gain proportional to the power level commands received by the terminal, and said second variable gain amplifier adapted to provide a gain proportional to relative power levels of signals received by the mobile terminal's receiver.

11. The mobile terminal power control circuit of claim 1 wherein the power level commands are based on power control signals originating from the base station.

12. The mobile terminal power control circuit of claim 1 wherein the control signal to said first variable gain amplifier depends at least in part upon calibration or factory alignment information.

13. The mobile terminal power control circuit of claim 1 wherein the mobile terminal includes processing circuitry providing the control signals corresponding to power level commands, said second variable gain amplifier receiving control signals based on said control signals from said processing circuitry.

14. The circuit of claim 1 wherein the gains for said variable gain amplifiers are allocated to provide an overall variable gain having a range adequate for mobile operation and the gain for said variable gain amplifier corresponding to power level commands is variable over a range allowing for calibration of the mobile device to compensate for component variation in manufacturing.

15. A power amplification circuit in a mobile communications device comprising:

a power amplification signal path in a mobile communications device for amplifying a mobile communication signal to be transmitted;

a digital controlled variable gain amplifier in said signal path;

an analog controlled variable gain amplifier in said signal path;

said digital controlled variable gain amplifier having a digital gain control input and adapted to provide a gain proportional to a digital value received at the digital gain control input;

said analog controlled variable gain amplifier having an analog gain control input and adapted to provide a gain proportional to an analog signal received at the analog gain control input; and wherein the gains for said digital and analog controlled variable gain amplifiers are proportioned to provide an overall variable gain having a range of approximately 85 dB so as to be adequate for mobile operation and said digital controlled variable gain amplifier's gain is variable over a range of approximately 20 dB allowing for calibration of the mobile device to compensate for component variation in manufacturing.

16. A power amplification circuit in a mobile communications device comprising:

a power amplification signal path in a mobile communications device for amplifying a mobile communication signal to be transmitted;

a digital controlled variable gain amplifier in said signal path;

an analog controlled variable gain amplifier in said signal path;

said digital controlled variable gain amplifier having a digital gain control input and adapted to provide a gain proportional to a digital value received at the digital gain control input;

said analog controlled variable gain amplifier having an analog gain control input and adapted to provide a gain proportional to an analog signal received at the analog gain control input; and wherein said circuit includes a mixer in said signal path between said first and second variable gain amplifiers, said mixer configured to alter the frequency of said signals in said signal path from a first frequency to a second frequency.

17. The mobile terminal power control circuit of claim 16 wherein the first frequency is an intermediate frequency used for spread spectrum communications.

18. The mobile terminal power control circuit of claim 17 wherein the second frequency is a radio frequency for final signal transmission.

19. The mobile terminal power control circuit of claim 18 wherein the digital controlled variable gain amplifier operates about the first frequency and the analog controlled variable gain control amplifier operates about the second frequency.

20. The mobile terminal power control circuit of claim 18 wherein the analog controlled variable gain amplifier operates about the first frequency and the digital controlled variable gain control amplifier operates about the second frequency.

21. A power amplification circuit in a mobile communications device comprising:

a power amplification signal path in a mobile communications device for amplifying a mobile communication signal to be transmitted;

a digital controlled variable gain amplifier in said signal path;

an analog controlled variable gain amplifier in said signal path;

said digital controlled variable gain amplifier having a digital gain control input and adapted to provide a gain proportional to a digital value received at the digital gain control input;

said analog controlled variable gain amplifier having an analog gain control input and adapted to provide a gain proportional to an analog signal received at the analog gain control input; and wherein said digital controlled variable gain amplifier is adapted to receive gain control signals responsive to relative power levels of signals received by the mobile terminal's receiver.

22. A power amplification circuit in a mobile communications device comprising:

a power amplification signal path in a mobile communications device for amplifying a mobile communication signal to be transmitted;

a digital controlled variable gain amplifier in said signal path;

an analog controlled variable gain amplifier in said signal path;

said digital controlled variable gain amplifier having a digital gain control input and adapted to provide a gain proportional to a digital value received at the digital gain control input;

said analog controlled variable gain amplifier having an analog gain control input and adapted to provide a gain proportional to an analog signal received at the analog gain control input; and wherein said analog controlled variable gain amplifier is adapted to receive gain control signals corresponding to power level commands.

23. In a wireless communications system in which users communicate using spread spectrum communications via a mobile terminal and at least one base station, a transmission power control method for controlling transmission signal power for a mobile terminal, wherein each mobile terminal includes an antenna and a receiver, said method comprising:

a. providing a signal path in a mobile communication device for amplifying a signal to be transmitted, said path having a first portion for the signal gain controlled at an intermediate frequency and a second portion for the signal further gain controlled at a final radio transmission frequency;

b. amplifying signals operating about the intermediate frequency in said first portion of said signal path in response to power level commands; and c. amplifying signals operating about the final radio transmission frequency in said second portion of said signal path in proportional response to relative power levels of signals received by the mobile terminal's receiver.

24. An integrated circuit providing for transmission power level control in a wireless communications system mobile terminal, said integrated circuit comprising:

a. an integrated circuit package;

b. a signal path in said package for amplifying a signal to be transmitted, said path having a first portion for the signal gain controlled at a first frequency and a second portion for the signal further gain controlled at a second frequency;

c. a first variable gain amplifier for amplifying signals operating about the first frequency in said first portion of said signal path, said first variable gain amplifier having a gain control input and adapted to provide amplification gain proportional to a first control signal received at the gain control input;

d. a second variable gain amplifier for amplifying signals operating about the second frequency in said second portion of said signal path, said first variable gain amplifier having a gain control input and adapted to provide amplification gain proportional to a second control signal received at the gain control input; and e. one of said first or second control signals being proportional to relative power levels of signals received by the mobile terminal's receiver and the other of said first or second control signals corresponding to power level commands.

25. The integrated circuit of claim 24 further including a mixer in said signal path between said first and second variable gain amplifiers, said mixer configured to alter the frequency of said signals in said signal path from the first frequency to the second frequency.

26. The integrated circuit of claim 24 wherein the first frequency is an intermediate frequency used for spread spectrum communications and the second frequency is a radio frequency for final transmission.

27. The integrated circuit of claim 24 wherein said first variable gain amplifier receives said control signal corresponding to power level commands and said second variable gain amplifier receives said control signal proportional to relative power levels of signals received by the mobile terminal's receiver.

28. The integrated circuit of claim 24 wherein said first variable gain amplifier is a analog controlled variable gain amplifier and said second variable gain amplifier is an digital controlled variable gain amplifier, said first variable gain amplifier adapted to provide a gain proportional to the power level commands received by the terminal, and said second variable gain amplifier adapted to provide a gain proportional to relative power levels of signals received by the mobile terminal's receiver.

29. The integrated circuit of claim 24 wherein said first variable gain amplifier is a digitally controlled variable gain amplifier and said second variable gain amplifier is an analog controlled variable gain amplifier, said first variable gain amplifier adapted to provide a gain proportional to the power level commands received by the terminal, and said second variable gain amplifier adapted to provide a gain proportional to relative power levels of signals received by the mobile terminal's receiver.

30. In a wireless communications system in which users communicate using spread spectrum communications via a mobile terminals and at least one base station, a transmission power control circuit for controlling transmission signal power for a mobile terminal, wherein each mobile terminal includes an antenna and a receiver, said power control circuit comprising:

a. a signal path in the mobile terminal amplifying a signal to be transmitted, said path having a first portion for said signal gain controlled at a first frequency and a second portion for said signal further gain controlled at a second frequency;

b. a first variable gain amplifier for amplifying signals operating about the first frequency in said first portion of said signal path, said first variable gain amplifier having a gain control input and adapted to provide amplification gain proportional to a first control signal received at the gain control input;

c. a second variable gain amplifier for amplifying signals operating about the second frequency in said second portion of said signal path, said second variable gain amplifier having a gain control input and adapted to provide amplification gain proportional to a second control signal received at the gain control input;

d. an auxiliary input for inputting calibration type information; and e. one of said first or second control signals being responsive to relative power levels of signals received by the mobile terminal's receiver and the other of said first or second control signals corresponding to said calibration type information.

31. The mobile terminal power control circuit of claim 30 wherein said control signal responsive to relative power levels of signals received by the mobile terminal's receiver is further responsive to power level commands.

32. The mobile terminal power control circuit of claim 30 wherein the first frequency is an intermediate frequency used for spread spectrum communications and the second frequency is a radio frequency for final transmission.

33. The mobile terminal power control circuit of claim 30 wherein said first variable gain amplifier receives said control signal responsive to power level commands and said second variable gain amplifier receives said control signal corresponding to said calibration type information.

34. The mobile terminal power control circuit of claim 30 wherein said first and second portions of said signal path and said first and second variable gain amplifiers are integrated into a single integrated circuit chip.

35. The mobile terminal power control circuit of claim 30 wherein said first variable gain amplifier is a analog controlled variable gain amplifier and said second variable gain amplifier is an digital controlled variable gain amplifier, said first variable gain amplifier adapted to provide a gain proportional to the power level commands received by the terminal, and said second variable gain amplifier adapted to provide a gain corresponding to said calibration type information.

36. The mobile terminal power control circuit of claim 30 wherein said first variable gain amplifier is a digitally controlled variable gain amplifier and said second variable gain amplifier is an analog controlled variable gain amplifier, said first variable gain amplifier adapted to provide a gain proportional to the power level commands received by the terminal, and said second variable gain amplifier adapted to provide a gain corresponding to said calibration type information.

37. The mobile terminal power control circuit of claim 31 wherein the power level commands are based on power control signals originating from the base station.

38. In a wireless communications system in which users communicate using spread spectrum communications via a mobile terminal and at least one base station, a transmission power control method for controlling transmission signal power for a mobile terminal, wherein each mobile terminal includes an antenna and a receiver, said method comprising:

a. providing calibration type information;

b. providing a signal path in a mobile communication device for amplifying a signal to be transmitted, said path having a first portion for the signal gain controlled at a first frequency and a second portion for the signal further gain controlled at a second frequency;

c. amplifying signals operating about the first frequency in said first portion of said signal path at a first variable gain amplifier in response to power level commands and in response to relative power levels of signals received by the mobile terminal's receiver; and d. amplifying signals operating about the second frequency in said second portion of said signal path at a second variable gain amplifier according to said calibration type information.

39. The method of claim 38 wherein said first frequency is an intermediate frequency and wherein said second frequency is a final radio transmission frequency.

40. The method of claim 38 wherein said second frequency is an intermediate frequency and wherein said first frequency is a final radio transmission frequency.

41. The method of claim 38 wherein said first portion of said signal path is upstream from said second portion of said signal path.

* * * * *